(12) United States Patent
Noda et al.

(10) Patent No.: US 6,698,500 B2
(45) Date of Patent: Mar. 2, 2004

(54) HEAT SINK WITH FINS

(75) Inventors: Hajime Noda, Tokyo (JP); Kenya Kawabata, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/377,141

(22) Filed: Feb. 26, 2003

(65) Prior Publication Data

US 2003/0178181 A1 Sep. 25, 2003

Related U.S. Application Data

(63) Continuation-in-part of application No. 10/055,619, filed on Jan. 22, 2002, now Pat. No. 6,554,060.

(51) Int. Cl.[7] .................................................. F28F 7/00
(52) U.S. Cl. ...................... 165/80.3; 165/185; 361/697; 361/704; 174/16.3; 257/722
(58) Field of Search ................................ 165/80.3, 185; 361/697, 704, 709; 257/722, 706; 174/16.3

(56) References Cited

U.S. PATENT DOCUMENTS

| | | | |
|---|---|---|---|
| 4,923,000 A | 5/1990 | Nelson | |
| 5,619,018 A | 4/1997 | Rossi | |
| 6,263,956 B1 | 7/2001 | Tang et al. | |
| 6,367,152 B1 | 4/2002 | Kataoka | |

*Primary Examiner*—Terrell McKinnon
(74) *Attorney, Agent, or Firm*—Oblon, Spivak, McClelland, Maier & Neustadt, P.C.

(57) ABSTRACT

A heat sink with fins comprising a group of heat dissipating fins which comprise combination of heat dissipating fins made of at least two kinds of metals having different heat conductivity, and a metal base plate on which surface portion the group of heat dissipating fins are densely jointed.

10 Claims, 5 Drawing Sheets

HEAT SINK WITH FINS

RELATED APPLICATIONS

This application is a continuation-in-part, and hereby incorporates by reference the entire disclosure, of co-pending U.S. patent application Ser. No. 10/055,619, entitled "HEAT SINK WITH FINS", which was filed on Jan. 22, 2002, now U.S. Pat. No. 6,554,060.

BACKGROUND OF THE INVENTION

1. Field of the Invention

The present invention relates to a heat sink with fins used for cooling electronic devices, and in particular relates to the heat sink with fins in which heat dissipating fins are jointed on a metal base plate.

2. Description of the Related Art

In order to dissipate the heat generated by a semiconductor chip, which is increasing year by year, there is known a method in which a heat sink is attached in close contact to the semiconductor chip so as to transfer the heat from the semiconductor chip to the heat sink, and dissipate same. A conventional heat sink has a metal flat base plate so as for the semiconductor chip to be closely contacted thereon, and has construction that plural heat dissipating fins of metal thin plates are jointed on the surface opposite to the surface of the base plate on which the semiconductor chip is attached.

In the heat sink with fins having the above-mentioned construction, the heat generated by the semiconductor chip transfers from the semiconductor chip to the metal base plate which is closely contacted thereto, and spreads over the base plate, and thus spread heat is dissipated into air or the designated place by the metal heat dissipating fins which are fixed on the surface of the metal base plate. In addition, there is provided a one-piece heat sink made of forged aluminum as one of the conventional heat sinks. However, there is a problem in which the one-piece heat sink made of forged aluminum do not attain enough heat dissipating effect, because required number of heat dissipating fins are not formed due to the technical difficulty by forging to shorten the pitch between the heat dissipating fins for the required level of fin-density.

In order to solve the above-mentioned problem and obtain much more excellent heat dissipating effect, there is proposed a method instead of a one-piece heat sink, in which a base plate and heat dissipating fins are separately manufactured and the heat dissipating fins are jointed on a surface of the base plate by means of brazing or mechanical joint.

The mechanical joint in which the heat dissipating fins are jointed mechanically on a surface portion of the base plate is superior to the brazing, because manufacturing cost of brazing is higher than that of mechanical joint.

As shown in FIG. 4, when the size of the semiconductor chip 30 and the base plate 22 are compared, the semiconductor chip 30 is much smaller than the base plate 22. Therefore it is necessary to spread the heat generated by the small semiconductor chip 30 all over the large base plate 22 by using the base plate made of materials having high heat conductivity such as copper, aluminum or the like. In particular, since the copper is excellent in heat conductivity, the copper is known as a material for the base plate of the heat sink with fins. However, since the copper is heavy and the copper base plate must be in direct contact with the semiconductor chip, there is required some reinforcing construction (for example: applying a jointing device for protecting a circuit board or the like) to reduce the damage that the weight of the copper base plate imposes onto the semiconductor chip.

Furthermore, electronic devices become remarkably lighter and smaller, which makes it difficult to use the copper base plate because the chance to use such heavy copper base plate is reducing and it becomes difficult to secure the space for installing the copper base plate. On the other hand, when the semiconductor chip becomes more integrated and the processing capacity becomes higher, the heat generated by the semiconductor chip becomes larger. Therefore, further higher heat dissipating effect is required for stable operation of the semiconductor chip or the like.

As described above, it becomes difficult to use the copper base plate due to the heavy weight thereof in spite of the excellent heat conductivity. Therefore, when aluminum is to be used for material of the based plate, it is necessary to satisfy the requirement of further increasing heat dissipating effect of the heat sink.

In the heat sink having construction that the heat dissipating fins are mechanically fixed on a surface of the base plate, the base plate has the following temperature distribution when the heat dissipation is in the stable condition. More specifically, the temperature is the highest in the central portion of the base plate to which the semiconductor chip is attached in close contact and, the temperature becomes lower as the portion in the base plate moves farther from the semiconductor chip.

In addition, the heat dissipating fins which are fixed and thermally connected to a surface of the base plate has the following temperature distribution. More specifically, the temperature is the highest in the heat dissipating fins locating in the central portion of the base plate to which the semiconductor chip is attached in close contact, and the temperature is the lowest in the heat dissipating fins locating in the end portions of the base plate which are far apart from the central portion.

Furthermore, the heat dissipating fin itself has the following temperature distribution along the height direction. More specifically, the temperature is the highest in the bottom portion of the fin which is fixed and thermally connected to the base plate and, the temperature becomes lower as the portion moves farther from the bottom portion.

It proves that the heat is transferred by heat conduction in the heat dissipating fin.

However, it is desirable to minimize difference of temperature across the entire portion of the heat sink with fins, from the heat dissipating efficiency point of view. As described above, lately, the heat generated by the semiconductor chip is increasing, and at the same time, the semiconductor chip is more downsized, which tends to rapidly increase the heat density. Therefore it is urgently required to improve heat dissipating efficiency of the heat sink with fins (for example, increasing density of the heat dissipating fins fixed on the base plate, or using a heat pipe in the base plate, or the like). In particular, it is strongly demanded to increase heat dissipating efficiency by reducing difference of temperature in the portions of the above-mentioned heat sink with fins.

As mentioned above, there is a problem in which a one-piece heat sink made of forged aluminum does not attain enough that dissipating effect, because the required number of the heat dissipating fins are not formed due to the technical difficulty by forging to shorten the pitch between fins for the required level of fin-density. Furthermore, there is also a problem in which using the heavy copper base plate becomes difficult due to the heavy weight thereof even if the heat conductivity is excellent. Therefore, it is strongly demanded to increase heat dissipating efficiency of the heat sink with fins having construction that the heat dissipating fins are mechanically fixed on a surface of the aluminum base plate.

However the heat sink having construction that the heat dissipating fins are mechanically fixed on a surface of the aluminum base plate has problem in heat dissipating efficiency, because there are temperature difference both in the base plate and the heat dissipating fins.

SUMMARY OF THE INVENTION

There is provided according to the invention a heat sink with fins comprising groups of heat dissipating fins which comprise at least two groups of heat dissipating fins, which are made of at least two kinds of metals having different heat conductivity, said heat dissipating fins of each group being made of same metal, respectively and a metal base plate on which surface portion said groups of heat dissipating fins are densely jointed, wherein a part of said at least two groups of heat dissipating fins are integrally formed with said metal base plate.

DETAILED DESCRIPTION OF THE PREFERABLE EMBODIMENTS

Figure 1:
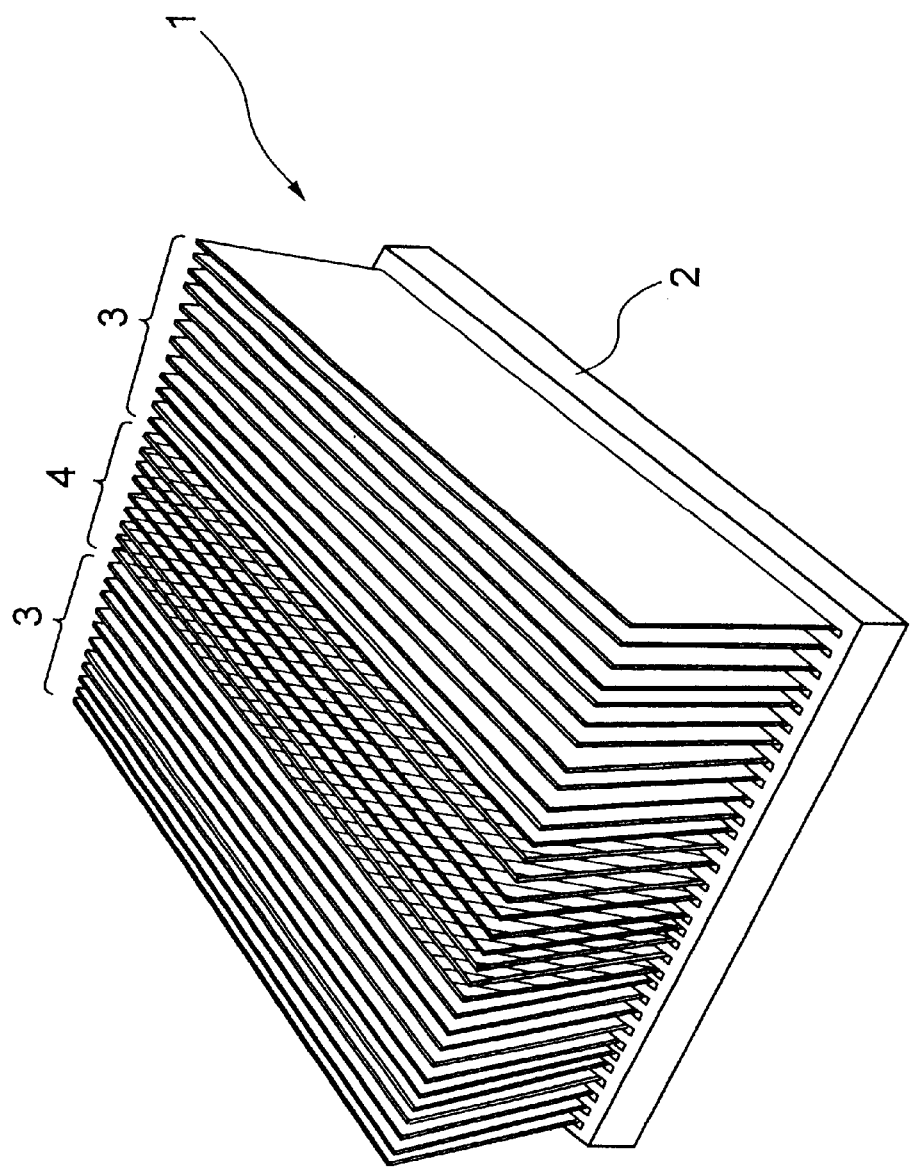
FIG. 1 shows one embodiment of a heat sink with fins of the invention.

With reference to the attached drawings, the heat sink with fins of the present invention is explained in detail.

To solve the problem in the conventional art, the present inventors have intensively studied. As a result, it has been found that difference of temperature in the base plate can be reduced by the following: the heat dissipating fins are made of two kinds of metals having different heat conductivity, the heat dissipating fins made of the metal having higher heat conductivity are located on the portion of the base plate close to a heat generating element such as a semiconductor chip or the like, and the heat dissipating fins made of the metal having relatively lower heat conductivity are located in the remaining portion of the base plate.

It has also been found that difference of temperature in the heat dissipating fins which are located on the portion of the base plate close to the heat generating element can be reduced by using the metal having high heat conductivity.

More specifically, the heat dissipating efficiency of the heat sink can be improved by reducing difference of temperature both in the base plate and in the heat dissipating fins by the following: using the aluminum for the base plate, using copper for the heat dissipating fins locating close to the heat generating element such as a semiconductor chip or the like, and using aluminum for the heat dissipating fins located in the remaining portion of the base plate.

One of the objects of the invention is to solve the problem in the conventional art and to provide a heat sink with fins having high heat dissipating efficiency wherein plural heat dissipating fins are densely fixed on one side of the surfaces of an aluminum base plate, and in particular supply a light weight heat sink with fins having small difference of temperature of each part both in the base plate and the heat dissipating fins. Further more, other object of the invention is also to provide a heat sink with fins having design flexibility, good workability and low cost.

One embodiment of the heat sink with fins of the present invention is a heat sink with fins comprising: a group of heat dissipating fins which comprise combination of heat dissipating fins made of at least two kinds of metals having different heat conductivity; and a metal base plate on which surface portion said group of heat dissipating fins are densely jointed.

In other embodiment of the heat sink with fins of the invention, each piece of said heat dissipating fins forming said group of heat dissipating fins is arranged to locate so as to reduce difference of temperature both in said metal base plate and in said group of heat dissipating fins.

In other embodiment of the heat sink with fins of the invention, at least part of said group of heat dissipating fins locating close to a portion of the metal base plate on which a heat generating element is attached are made of copper.

Other embodiment of the heat sink with fins of the invention comprises: a metal base plate to one side of which surfaces a heat generating element is attached in close contact; and a group of heat dissipating fins comprising plural heat dissipating fins of thin metal plates made of at least two kinds of materials having different heat conductivity, inserted into each of plural grooves formed on other side of the surfaces of said metal base plate, and then crimped from both directions of the grooves by pressing to deform portions of the metal base plate between said grooves, thus fixed on said metal base plate.

In other embodiment of the heat sink with fins of the invention, said group of heat dissipating fins comprise heat dissipating fins made of two kinds of metals having different heat conductivity, and part of said group of heat dissipating fins locating close to a portion on which said heat generating element is attached are made of material having higher heat conductivity than that of heat dissipating fins locating in remaining portion of the metal base plate.

In other embodiment of the heat sink with fins of the invention, said two kinds of metals are copper and aluminum, and said part of said group of heat dissipating fins locating close to the portion on which said heat generating element is attached are made of copper and said heat dissipating fins locating in the remaining portion are made of aluminum.

In other embodiment of the heat sink with fins of the invention, said metal base plate is made of aluminum.

In other embodiment of the heat sink with fins of the invention, number of said heat dissipating fins made of copper is within a range from 25% to 75% in total number of said heat dissipating fins.

FIG. 1 shows one embodiment of the heat sink with fins of the present invention. As shown in FIG. 1, the heat sink with fins 1 of the present invention comprises the base plate 2 made of aluminum, and the group of heat dissipating fins to be inserted into each of plural grooves formed on one side of the surfaces of the aluminum base plate and mechanically jointed on the base plate by being crimped from both sides of the grooves by pressing to deform the portions of the metal base plate between the grooves. The group of heat dissipating fins comprise the copper heat dissipating fins 4 locating in the central portion of the base plate and the aluminum heat dissipating fins 3 locating on both sides of the copper heat dissipating fins 4.

Figure 2:
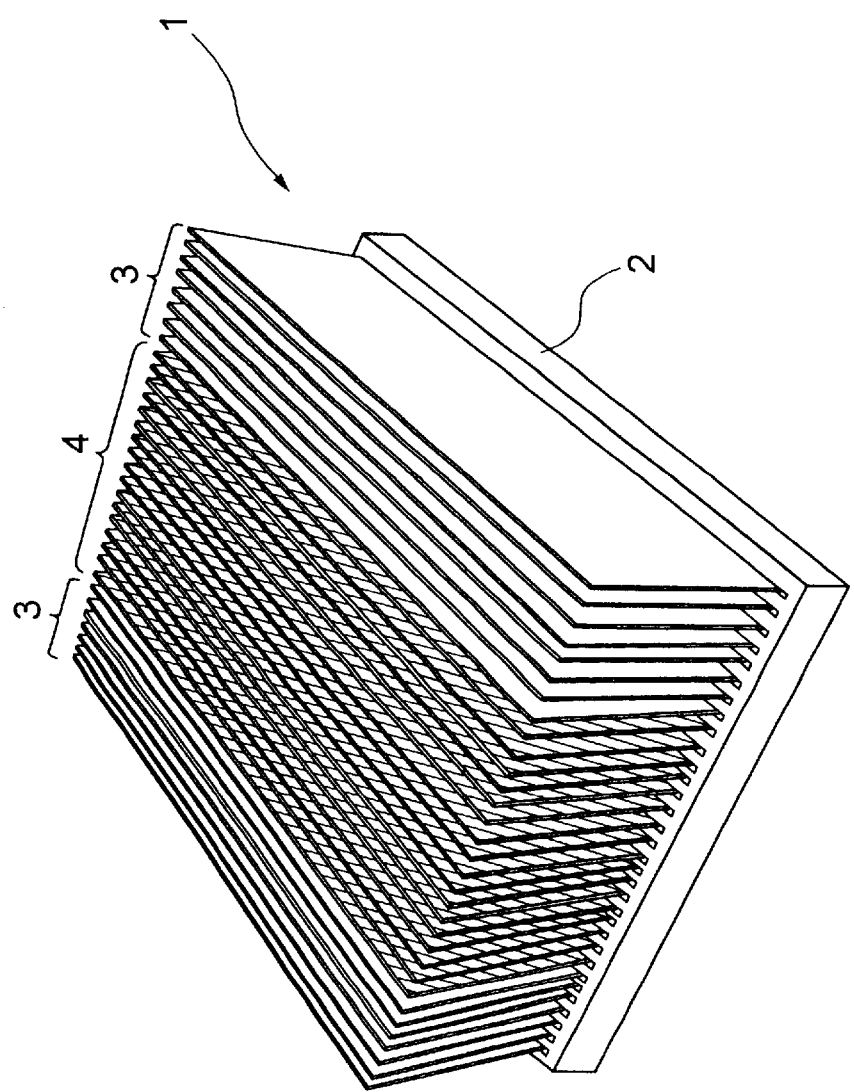
FIG. 2 shows another embodiment of a heat sink with fins of the invention.

FIG. 2 shows another embodiment of the heat sink with fins of the present invention. As shown in FIG. 2, as well as FIG. 1, the heat sink with fins 1 of the present invention comprises the base plate 2 made of aluminum, and the group of heat dissipating fins to be inserted into each of plural grooves made on the aluminum base plate and mechanically jointed on the base plate by being crimped from both sides of the grooves by pressing to deform the portions of the metal base plate between the grooves. The group of heat dissipating fins comprise the copper heat dissipating fins 4 locating in the central portion of the base plate and the aluminum heat dissipating fins 3 locating on both sides of the copper heat dissipating fins 4. Embodiments shown in FIG. 1 and FIG. 2 are different in the number of copper fins. More specifically, the number of copper fins in FIG. 2 is larger than that in FIG. 1.

In the above-mentioned embodiment, the group of heat dissipating fins are mechanically jointed on the base plate. However the group of heat dissipating fins may also be jointed on the base plate by means of soldering, silver soldering, welding or the like.

Figure 3:
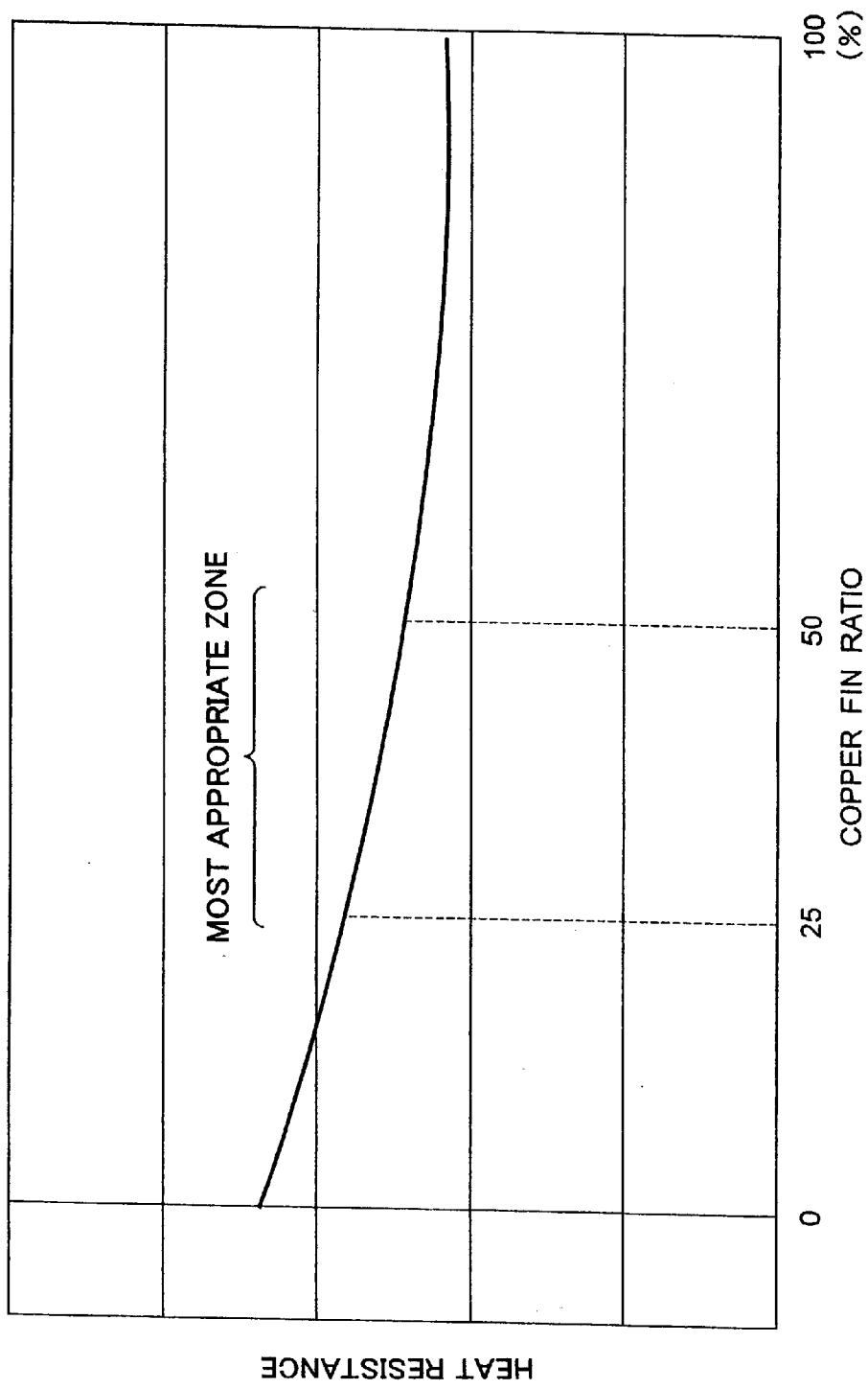
FIG. 3 is a graph to show relationship between copper fin ratio (ratio of number of heat dissipating fins made of copper in total number of heat dissipating fins) and thermal resistance.
Figure 4:
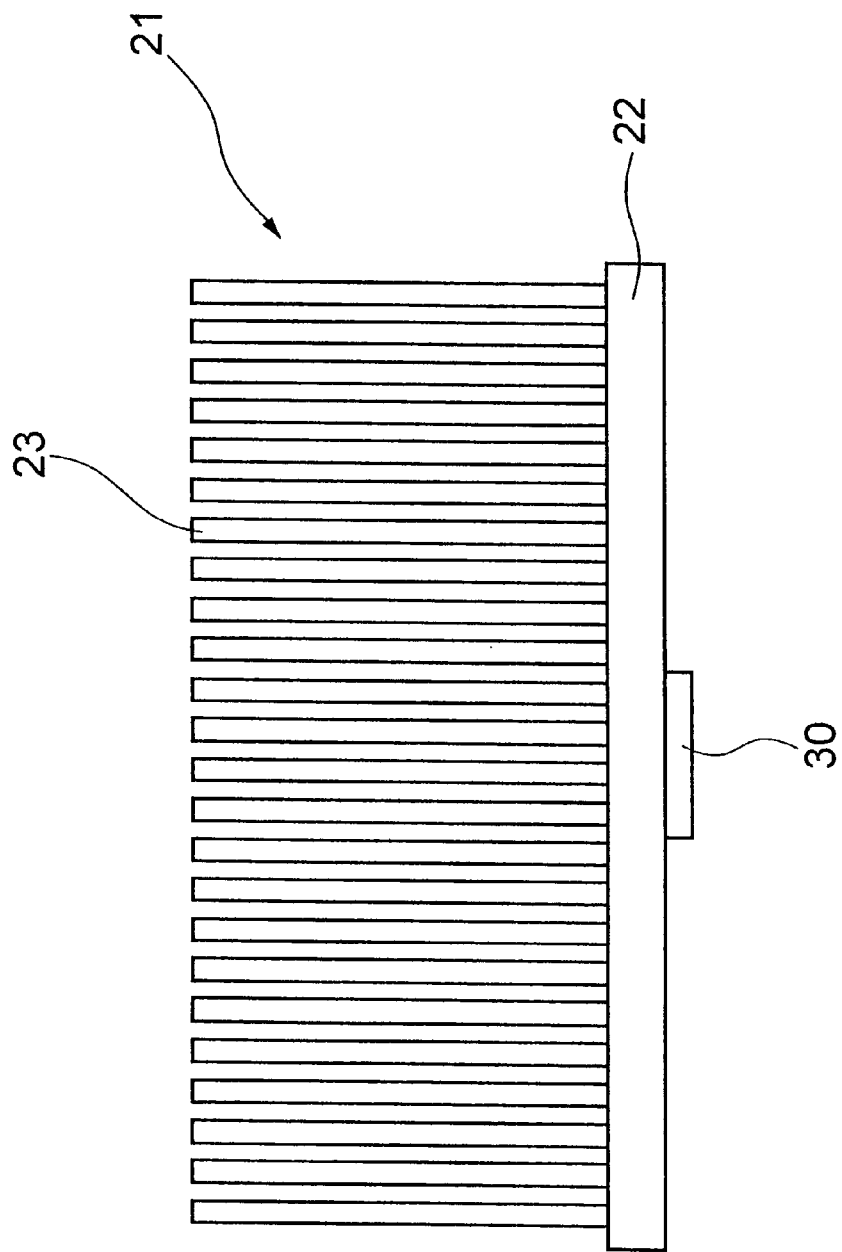
FIG. 4 shows a heat sink to which a semiconductor chip or the like is attached in close contact.

FIG. 3 is a graph showing relationship between copper fin ratio (More specifically, ratio of number of the heat dissipating fins made of copper in the total number of heat dissipating fins) and thermal resistance. In FIG. 3, the vertical direction shows thermal resistance, and the horizontal direction shows copper fin ratio (%). As clearly shown in FIG. 3, the thermal resistance is the highest when the copper fin ratio is 0%, and the thermal resistance is the lowest when the copper fin ratio is 100%. More specifically, within the range of copper ratio from 0% to 100%, the higher the copper fin ratio becomes, the lower the thermal resistance becomes.

On the other hand (not shown in the drawing), the higher the copper fin ratio becomes, the heavier the heat dissipating fins become, and the manufacturing cost thereof increases accordingly. When the copper fin ratio is below 25%, the thermal resistance is high, thus lowering heat dissipating efficiency of the heat sink. On the other hand, when the copper fin ratio becomes over 75%, the thermal resistance is not sufficiently reduced anymore. Therefore effectiveness to lower thermal resistance becomes small due to the weight increase and the cost increase.

Therefore, the copper fin ratio is preferable within a range from 25% to 75%.

As mentioned above, in the heat sink of the present invention, it is desirable that the material of the heat dissipating fins locating close to the portion of the base plate on which the semiconductor chip or the like is attached has higher heat conductivity than that of the heat dissipating fins locating in the remaining portion of the base plate. More specifically, material of the heat dissipating fins locating close to the portion of the base plate on which the semiconductor chip or the like is attached is copper and material of the heat dissipating fins locating in the remaining portion of the base plate is aluminum.

A1050, A6063 and A5055 is applicable for the aluminum material of the base plate for the heat sink with fins of the present invention, and in particular pure aluminum (A1050) is desirable.

C1020 and C1100 is applicable for the copper material of heat dissipating fins, and in particular C1020 is desirable.

For the aluminum material of the heat dissipating fins, the same material as the base plate is desirable.

A heat sink with fins of another embodiment of the invention comprises groups of heat dissipating fins which comprise at least two groups of heat dissipating fins, which are made of at least two kinds of metals having different heat conductivity, the heat dissipating fins of each group being made of same metal, respectively and a metal base plate on which surface portion said groups of heat dissipating fins are densely jointed, wherein a part of the at least two groups of heat dissipating fins are integrally formed with the metal base plate.

In addition, in the heat sink with fins of the invention, the part of the at least two groups of heat dissipating fins are arranged so as to be at outer sides of said groups of heat dissipating fins. Furthermore, in the heat sink with fins of the invention, the integrally formed part of the at least two groups of heat dissipating fins and the metal base plate comprises an aluminum extrusion molding product. The integrally formed part of the at least two groups of heat dissipating fins and the metal base plate may comprise an aluminum diecasting product.

Figure 5:
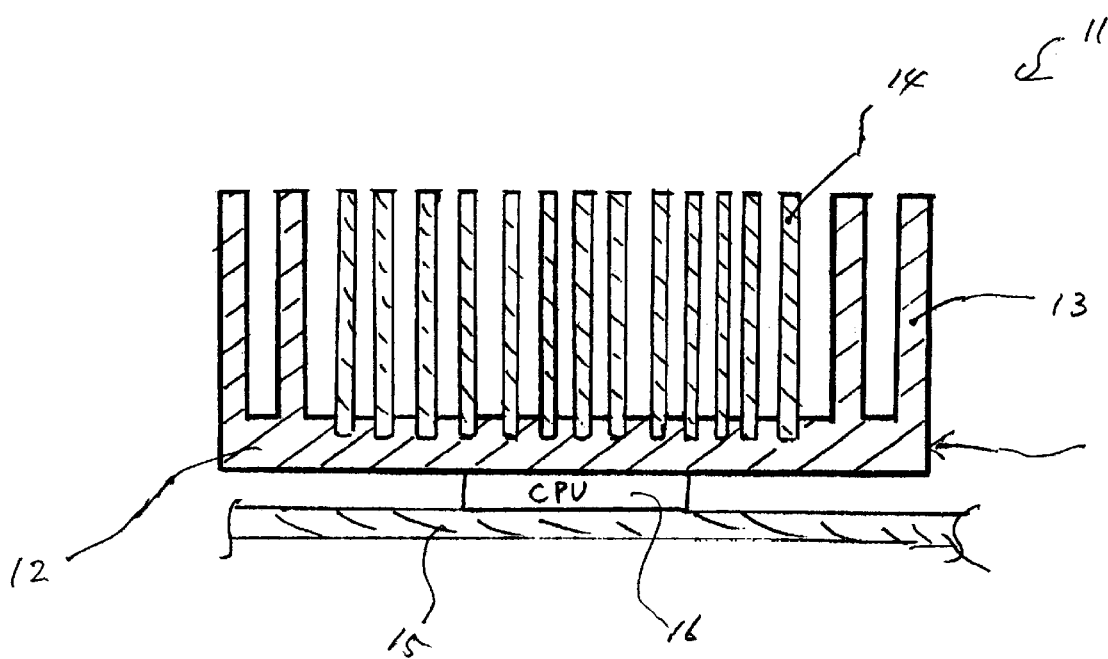
FIG. 5 shows another embodiment of a heat sink with fins of the invention.

FIG. 5 shows a heat sink having fins in accordance with another embodiment of the invention. As shown in FIG. 5, the metal base plate 12 and the fins 13 as the part of two groups of heat dissipating fins are integrally formed, for example, by an aluminum extrusion molding product. In this embodiment, respective outermost two fins 13 are integrally formed with the metal base plate 12. The thin fins 14 are made of copper.

Furthermore, the thin fins 14 may comprise two groups of heat dissipating fins, which are made of two kinds of metals having different heat conductivity, for example, copper and aluminum.

The heat sink with fins 11 of the invention is arranged so that the metal base plate is attached to the semiconductor chip 16 such as a CPU mounted on the printed circuit board 15.

According to the heat sink with fins of the invention as described above, since the part of the heat dissipating fins are integrally formed with the metal base plate, and are arranged so as to be at the outer sides of the groups of heat dissipating fin, the relatively thin fins located between the integrally formed fins may be protected, thus avoiding the problem in which the fins are erroneously deformed when the heat sink with fins are fixed to the electrical device, or the heat sink with fins are transported.

In addition, a heat sink with fins comprises a metal base plate to one side of which surfaces a heat generating element is attached in close contact, and a group of heat dissipating fins comprising plural heat dissipating fins of thin metal plates made of at least two kinds of materials having different heat conductivity, inserted into each of plural grooves formed on other side of the surfaces of said metal base plate, and then crimped from both directions of the grooves by pressing to deform portions of the metal base plate between said grooves, thus fixed on said metal base plate, wherein a part of said at least two groups of heat dissipating fins are integrally formed with said metal base plate.

The embodiment of the heat sink with fins described with reference to FIG. 5 may be combined with a part or all of the other embodiments described with reference to FIGS. 1 to 4.

For example, each piece of said heat dissipating fins forming the groups of heat dissipating fins is arranged to locate so as to reduce difference of temperature both in the metal base plate and in the groups of heat dissipating fins. Furthermore, a group of the groups of heat dissipating fins locating close to a portion of the metal plate on which a heat generating element is attached are made of copper. The metal base plate is made of aluminum, and the number of the heat dissipating fins made of copper is within a range from 25% to 75% in total number of the heat dissipating fins.

EXAMPLE

The present invention is explained in more detail by the example.

As shown in FIG. 1, an aluminum base plate with dimension of 80 mm length, 65 mm width and 5 mm thickness is manufactured. Plural grooves are formed on one side of the aluminum base plate in which the heat dissipating fins are inserted. The copper heat dissipating fins and aluminum heat dissipating fins with the same dimension of 0.6 mm thickness and 30 mm height are inserted into the grooves with 2 mm pitch, and then the heat dissipating fins are mechanically jointed on the base plate by being crimped from both sides of the grooves by pressing to deform the portions of the metal base plate between the grooves. The group of heat dissipating fins comprise 30 pieces of heat dissipating fins in which 16 pieces of the copper heat dissipating fins locates in the central portion of the base plate and respective 7 pieces of aluminum heat dissipating fins locate on both sides of the copper heat dissipating fins.

A semiconductor chip of 20 mm×20 mm is attached in close contact to the other side of the heat dissipating fins of the base plate on which no heat dissipating fins are joined, and the condition of the heat dissipation is examined for the heat sink with fins manufactured as described above.

For comparison, as the same as shown in FIG. 1, an aluminum base plate with dimension of 80 mm length, 65 mm width and 5 mm thickness is manufactured. Plural grooves are formed on one side of the aluminum base plate to which the heat dissipating fins are inserted. The aluminum heat dissipating fins with dimension of 0.6 mm thickness and 40 mm height are inserted into the plural grooves with 2 mm pitch, and then the heat dissipating fins are mechanically jointed on the base plate by being crimped from both sides of the grooves by pressing to deform the portions of the metal base plate between the grooves. The group of heat dissipating fins comprise 30 pieces of aluminum heat dissipating fins.

A semiconductor chip of 20 mm×20 mm is attached in close contact to the other side of the heat dissipating fins of the base plate on which no heat dissipating fins are joined, and the condition of the heat dissipation is examined for the heat sink with fins manufactured as described above.

As the result, the thermal resistance between the temperature of the cooling air and the temperature of the surface of the semiconductor chip is reduced by 0.03 degree Celsius/W on the heat sink with fins of the present invention wherein 16 pieces of copper heat dissipating fins are fixed in the center and respective 7 pieces of aluminum heat dissipating fins are fixed on both sides of the copper heat dissipating fins on the surface portion of the base plate, compared to the heat sink with fins for comparison wherein 30 pieces of aluminum heat dissipating fins are fixed on the surface portion of the base plate.

As is clear from the foregoing, according to the present invention, the heat sink with fins having excellent heat dissipating efficiency is obtained together with reducing weight and manufacturing cost thereof.

Although the above example shows the case in which the heat dissipating fins are arranged so as to be located equally with 2 mm pitch on the base plate, pitches between the heat dissipating fins can be changed to reduce difference of temperature both in the base plate and the heat dissipating fins.

As described above, according to the present invention the following heat sink with fins can be provided: More specifically, the heat sink with fins in which the group of fins comprising the combination of the heat dissipating fins made of at least two kinds of metals having different heat conductivity are densely jointed on the surface portion of the base plate, and in particular, the light weight heat sink with fins having small difference of temperature both in the base plate as well as in the heat dissipating fins.

Additionally, the heat sink having design flexibility, excellent workability and low cost can be provided by means of the proper selection of metals for the base plate and the group of heat dissipating fins.

What is claimed is:

1. A heat sink with fins comprising a metal base plate to one side of which surfaces a heat generating element is attached in close contact, and a group of heat dissipating fins comprising plural heat dissipating fins of thin metal plates made of at least two kinds of materials having different heat conductivity, inserted into each of plural grooves formed on other side of surfaces of said metal base plate, and then crimped from both directions of the grooves by pressing to deform portions of the metal base plate between said grooves, thus fixed on said metal base plate, wherein a part of said at least two groups of heat dissipating fins are integrally formed with said metal base plate.

2. The heat sink with fins as claimed in claim 1, wherein said part of said at least two groups of heat dissipating fins are arranged so as to be at outer sides of said groups of heat dissipating fins.

3. The heat sink with fins as claimed in claim 2, wherein said integrally formed part of said at least two groups of heat dissipating fins and said metal base plate comprises an aluminum extrusion molding product.

4. A heat sink with fins comprising groups of heat dissipating fins which comprise at least two groups of heat dissipating fins, which are made of at least two kinds of metals having different heat conductivity, said heat dissipating fins of each group being made of same metal, respectively and a metal base plate on which surface portion said groups of heat dissipating fins are densely jointed, wherein a part of said at least two groups of heat dissipating fins are integrally formed with said metal base plate.

5. The heat sink with fins as claimed in claim 4, wherein said part of said at least two groups of heat dissipating fins are arranged so as to be at outer sides of said groups of heat dissipating fins.

6. The heat sink with fins as claimed in claim 5, wherein said integrally formed part of said at least two groups of heat dissipating fins and said metal base plate comprises an aluminum extrusion molding product.

7. The heat sink with fins as claimed in any one of claims 4 to 6, wherein each piece of said heat dissipating fins forming said groups of heat dissipating fins is arranged to locate so as to reduce difference of temperature both in said metal base plate and in said groups of heat dissipating fins.

8. The heat sink with fins as claimed in any one of claims 4 to 6, wherein a group of said groups of heat dissipating fins locating close to a portion of the metal plate on which a heat generating element is attached are made of copper.

9. The heat sink with fins as claimed in any one of claims 4 to 6, wherein said metal base plate is made of aluminum.

10. The heat sink with fins as claimed in any one of claims 4 to 6, wherein number of said heat dissipating fins made of copper is within a range from 25% to 75% in total number of said heat dissipating fins.

* * * * *